United States Patent [19]

Stahlhofen

[11] Patent Number: 4,457,999
[45] Date of Patent: Jul. 3, 1984

[54] LIGHT-SENSITIVE 1,2 QUINONE DIAZIDE CONTAINING MIXTURE AND LIGHT-SENSITIVE COPYING MATERIAL PREPARED THEREFROM WHEREIN IMAGED PRODUCED THEREIN IS VISIBLE UNDER YELLOW SAFETY LIGHT

[75] Inventor: Paul Stahlhofen, Wiesbaden, Fed. Rep. of Germany

[73] Assignee: Hoechst Aktiengesellschaft, Frankfurt am Main, Fed. Rep. of Germany

[21] Appl. No.: 425,387

[22] Filed: Sep. 28, 1982

[30] Foreign Application Priority Data

Nov. 9, 1981 [DE] Fed. Rep. of Germany ....... 3144499

[51] Int. Cl.³ .......................... G03C 1/60; G03C 1/54; G03C 1/72
[52] U.S. Cl. .................... 430/191; 430/189; 430/192; 430/193; 430/270; 430/280; 430/342; 430/344
[58] Field of Search ............... 430/191, 189, 270, 280, 430/342, 344, 292, 193, 192

[56] References Cited

U.S. PATENT DOCUMENTS

| | | | |
|---|---|---|---|
| 3,494,767 | 2/1970 | Laridon et al. | 430/193 |
| 3,969,118 | 7/1976 | Stahlhofen et al. | 96/91 |
| 4,101,323 | 7/1978 | Buhr et al. | 96/35 |
| 4,241,166 | 12/1980 | Klupfel et al. | 430/292 |
| 4,247,611 | 1/1981 | Sanders et al. | 430/191 |
| 4,266,000 | 5/1981 | Stahlhofen et al. | 430/193 |
| 4,311,782 | 1/1982 | Buhr et al. | 430/270 |
| 4,350,753 | 9/1982 | Shelnut et al. | 430/191 |
| 4,387,152 | 6/1983 | Stahlhofen | 430/193 |

FOREIGN PATENT DOCUMENTS

| | | | |
|---|---|---|---|
| 769670 | 10/1967 | Canada | 430/193 |
| 1041463 | 9/1966 | United Kingdom | 430/189 |
| 2038801 | 7/1980 | United Kingdom | 430/189 |

Primary Examiner—Charles L. Bowers, Jr.
Attorney, Agent, or Firm—Schwartz, Jeffery, Schwaab, Mack, Blumenthal & Koch

[57] ABSTRACT

Disclosed is a light-sensitive mixture comprising (a) a 1,2-quinonediazide or a mixture of ($a^1$) a compound forming an acid on exposure and ($a^2$) a compound having at least one C—O—C bond cleavable by acid; (b) a water-insoluble binder soluble in aqueous-alkaline solutions; (c) an organic compound forming an acid on exposure of the general formula I

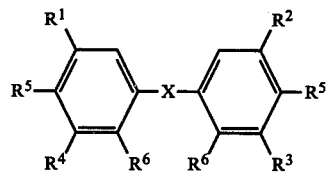

in which X is a single bond or one of the groups CO, $SO_2$, N=N or $CR^7R^8$, $R^1$, $R^2$, $R^3$ and $R^4$ are hydrogen atoms, halogen atoms or nitro groups, with not more than two of these radicals being hydrogen atoms and at least one thereof being a nitro group, $R^5$ and $R^6$ are hydrogen atoms or 1,2-naphthoquinone-2-diazide-4-sulfonyloxy radicals, with $R^5$ and $R^6$ being always different from each other, and $R^7$ and $R^8$ are hydrogen atoms or lower alkyl radicals, and (d) an azo dyestuff containing at least one nitro group in the molecule. Also disclosed are printing plates and photoresists prepared with the light-sensitive mixtures.

9 Claims, No Drawings

LIGHT-SENSITIVE 1,2 QUINONE DIAZIDE CONTAINING MIXTURE AND LIGHT-SENSITIVE COPYING MATERIAL PREPARED THEREFROM WHEREIN IMAGED PRODUCED THEREIN IS VISIBLE UNDER YELLOW SAFETY LIGHT

BACKGROUND OF THE INVENTION

The present invention relates to a light-sensitive mixture, which becomes soluble by exposure, comprising
(a) a 1,2-quinonediazide or a mixture of
  (a$^1$) a compound forming an acid on exposure and
  (a$^2$) a compound having at least one C—O—C bond cleavable by acid,
(b) a water-insoluble binder soluble in aqueous-alkaline solutions,
(c) an organic compound forming an acid on exposure, and
(d) a dyestuff.
After exposure, the mixture shows a clearly visible color contrast between exposed and unexposed areas.

Mixtures of the generic type indicated are preferably used for preparing planographic printing plates and photoresists, and such mixtures are known, for example, from U.S. Pat. No. 3,969,118. The mixtures described there contain as the dyestuff (d) a triphenylmethane, azine or anthraquinone dyestuff and as acid forming organic compound (c) a 1,2-naphthoquinone-2-diazide-4-sulfonyl halide. After image exposure they produce an image contrast which is clearly visible in daylight or in white artificial light. However, the image contrast is less pronounced, and in some cases inadequate under the yellow safety light customarily used when working with reprographic materials.

U.S. Pat. No. 3,929,488 describes corresponding mixtures which contain certain azo dyestuffs as the dyestuffs and diazonium salts of strong acids as the acid donors. These mixtures produce only a relatively slight visual contrast in normal light and in safety light.

U.S. Pat. No. 4,163,672 and British Pat. No. 2,005,855 describe similar mixtures which contain diazonium salts as the acid donors and azo, triphenylmethane, azine or anthraquinone dyestuffs as the dyestuffs. Their contrast is likewise frequently inadequate in yellow safety light.

U.S. Pat. No. 4,160,671 describes corresponding mixtures which contain trihalogenomethyl-s-triazines or trihalogenomethyl-2-pyrones as the acid donors and azine, triphenylmethane or anthraquinone dyestuffs as the dyestuffs. The properties of these mixtures are similar to those of the abovementioned mixtures.

British Pat. No. 2,038,810 describes mixtures which contain as acid donors 1,2-naphthoquinone-2-diazide-4-sulfonic acid esters or amides of phenols or aromatic amines, which have electron-attracting substituents in the benzene nucleus. Preferred substituents are halogen atoms and nitro groups. The dyestuffs mentioned include triphenylmethane dyestuffs and oil-soluble dyestuffs. These mixtures produce color contrasts which are better discernible under yellow light than those produced by some of the other mixtures mentioned above; however, contrast still does not meet all requirements.

SUMMARY OF THE INVENTION

It is therefore an object of the present invention to provide an improved positive-working, light-sensitive mixture of the generic type described at the outset and which after imagewise exposure displays an image of the original which is better visible under yellow safety light than in the case of the previously proposed mixtures.

In particular, it is an object of the invention to provide such a mixture which after imagewise exposure displays a contrast-rich image of the original which is clearly visible even under yellow safety light.

A further object of the invention resides in providing an improved copying material utilizing the light-sensitive mixture of the invention.

In accomplishing the foregoing objects, there has been provided in accordance with one aspect of the present invention a light-sensitive mixture comprising (a) a 1,2-quinonediazide or a mixture of (a$^1$) a compound forming an acid on exposure and (a$^2$) a compound having at least one C—O—C bond cleavable by acid, (b) a water-insoluble binder soluble in aqueous-alkaline solutions, (c) an organic compound forming an acid on exposure comprising an ester of the general formula I

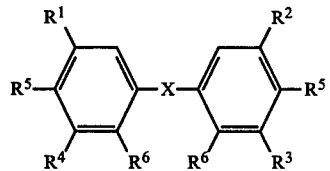

wherein
X is a single bond or one of the groups CO, SO$_2$, N=N or CR$^7$R$^8$
R$^1$, R$^2$, R$^3$ and R$^4$ are hydrogen atoms or halogen atoms or nitro groups, with not more than two of these groups being hydrogen atoms and at least one thereof being a nitro group,
R$^5$ and R$^6$ are hydrogen atoms or 1,2-naphthoquinone-2-diazide-4-sulfonyloxy radicals, with R$^5$ and R$^6$ being always different from each other, and
R$^7$ and R$^8$ are hydrogen atoms or lower alkyl radicals, and (d) a dyestuff comprising an azo dyestuff containing at least one nitro group in the molecule.

In accordance with another aspect of the invention, there has been provided a light-sensitive copying material comprising a support and a light-sensitive layer which becomes soluble in a developer on exposure and comprises a light-sensitive mixture as defined above.

Further objects, features and advantages of the present invention will become apparent from the detailed description of preferred embodiments which follows.

DETAILED DESCRIPTION OF PREFERRED EMBODIMENTS

The invention relates to a light-sensitive mixture comprising
(a) a 1,2-quinonediazide or a mixture of
  (a$^1$) a compound forming an acid on exposure and
  (a$^2$) a compound having at least one C—O—C bond cleavable by acid,
(b) a water-insoluble binder soluble in aqueous-alkaline solutions,
(c) an organic compound forming an acid on exposure and
(d) a dyestuff.

In the mixture according to the invention, the dyestuff is an azo dyestuff containing at least one nitro group in the molecule and the compound (c) forming an acid on exposure is an ester of the general formula I

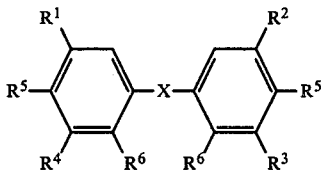

in which
X is a single bond or one of the groups CO, SO$_2$, N=N or CR$^7$R$^8$,
R$^1$, R$^2$, R$^3$ and R$^4$ are hydrogen atoms, halogen atoms or nitro groups, with not more than two of these radicals being hydrogen atoms and at least one thereof being a nitro group,
R$^5$ and R$^6$ are hydrogen atoms or 1,2-naphthoquinone-2-diazide-4-sulfonyloxy radicals, with R$^5$ and R$^6$ being always different from each other, and
R$^7$ and R$^8$ are hydrogen atoms or lower alkyl radicals.

The azo dyestuffs contained in the mixture contain at least one, and preferably 2 or more, nitro groups in the molecule. Monoazo dyestuffs, in particular those formed from substituted benzene-diazonium compounds and aromatic amines as coupling components, are preferable. The azo dyestuffs, in addition to nitro groups, can also contain further substituents. Examples of preferable substituents are amino groups, particularly tertiary amino groups, halogen atoms, alkoxy groups and acylamino groups. Owing to their particularly advantageous color contrast, blue azo dyestuffs are generally preferable. The amount of azo dyestuff is in general from about 0.5 to 10%, preferably from about 2 to 7%, by weight, relative to the nonvolatile constituents of the mixture.

The preferred photolytic acid donors of the formula I are those in which all radicals R$^1$ to R$^4$ are halogen atoms or nitro groups. The compounds which have at least two, particularly those with four nitro groups in the molecule are especially effective. Preferable halogen atoms are Cl and Br, particularly Br. R$^7$ and R$^8$, if alkyl radicals, generally have 1 to 4, preferably 1 or 2 carbon atoms.

Like the known naphthoquinonediazidesulfonic acid esters, the compounds of formula I are prepared by causing reactive sulfonic acid derivatives, for example, sulfonyl chlorides, to react with the corresponding substituted bisphenols. The acid donors are generally added in amounts of from about 1 to 20%, preferably 7 to 15% by weight, relative to the nonvolatile constituents.

The mixtures according to the invention can be stored, in the form of light-sensitive layers applied to a support or as solutions for preparing photoresist layers, in the dark over prolonged periods without decomposition. The image contrast obtained by means of the mixtures according to the invention is considerably more brilliant than the image contrast obtained by means of the same acid donors combined with triphenylmethane, azine or anthraquinone dyestuffs or with azo dyestuffs which do not contain nitro groups.

The mixture according to the invention contains as a further essential constituent a light-sensitive compound (a) or a light-sensitive combination of compounds (a$^1$-+a$^2$) the solubility of which in an aqueous alkaline developer solution is increased on exposure. The light-sensitive materials include in particular o-quinonediazides and combinations of photolytic acid donors with acid-cleavable compounds.

The o-quinonediazides preferably used are 1,2-naphthoquinone-2-diazide-4- or -5-sulfonic acid esters or amides. Of these, the esters, in particular those of 5-sulfonic acids, are particularly preferable. Suitable compounds of this type are known and have been described, for example, in German Pat. No. 938,233 and in German Offenlegungsschriften No. 2,331,377 (=U.S. Pat. No. 3,969,118), No. 2,547,905, and No. 2,828,037, the disclosures of which are hereby incorporated by reference.

The amount of o-quinonediazide compounds including the compounds of formula I is in general from about 3 to 50%, preferably from about 7 to 35% by weight, relative to the nonvolatile constituents of the mixture.

Materials based on acid-cleavable compounds can also be used with beneficial effect in the mixture according to the invention.

Copying materials of this type are known and have been described, for example, in U.S. Pat. Nos. 3,779,778 and 4,101,323, German Pat. No. 2,718,254 and German Offenlegungsschriften Nos. 2,829,512, 2,829,511 and 2,928,636, the disclosures of which are also incorporated by reference herein. They contain as acid-cleavable compounds orthocarboxylic acid derivatives, monomeric or polymeric acetals, enolethers or acylimino carbonates, of which the orthocarboxylic acid derivatives and acetals are preferable. As radiation sensitive, acid-eliminating compounds they predominantly contain organic halogen compounds, in particular, s-triazines substituted by halogenomethyl groups. Compounds of the formula I are basically also suitable for this purpose.

Of the orthocarboxylic acid derivatives described in U.S. Pat. No. 4,101,323, in particular, the diphenoxymethyl ethers of aliphatic or aromatic hydroxy compounds, the N-diphenoxymethyl derivatives of lactams and, most preferably, the bis-1,3-dioxan-2-yl ethers of aliphatic diols are used.

Among the polyacetals described in German Pat. No. 2,718,254 (equivalent to U.S. Pat. No. 4,247,611), those containing aliphatic aldehyde and diol units are preferable.

Of the polymeric ortho esters described in German Offenlegungsschrift No. 2,928,636 (equivalent to U.S. Pat. No. 4,311,782), polymers with recurring 1,3-dioxacyclohex-2-yl alkyl ether units, in which the alkyl ether group can be interrupted by ether oxygen atoms and is preferably bonded to the 5-position of the adjacent ring, are particularly preferable.

The amount of acid-cleavable compounds in the light-sensitive mixture is in general between about 8 and 60%, preferably between about 14 and 40% by weight, relative to the nonvolatile constituents of the mixture. The amount of acid-eliminating compound combined therewith is between about 0.1 and 10%, preferably between about 0.2 and 5% by weight.

Light-sensitive mixtures according to the invention preferably also contain a polymeric, water-insoluble resinous binder which is soluble in the solvents used for the mixture according to the invention and is also soluble, or at least swellable, in aqueous alkalis.

The novolak condensation resins found suitable in many positive copying materials based on naphthoquinonediazides have been found to be particularly useful and advantageous as an additive also in the case of mixtures according to the invention. They promote strong differentiation between exposed and unexposed areas of the layer on developing. This applies in particular to relatively highly condensed resins having substituted phenols, for example, cresols, as formaldehyde condensation partners. Further binders which are alkali-soluble, or swellable in alkali, and which are to be mentioned are natural resins, such as shellac and colophony, and synthetic resins, such as copolymers of styrene and maleic anhydride or copolymers of acrylic or methacrylic acid, in particular with acrylates or methacrylates.

The type and amount of alkali-soluble resin can vary according to the intended use. Proportions of the total solids content between about 95 and 35%, particularly from about 90-55% by weight, are preferable. Numerous other resins can also be used in the mixture, in addition to the abovementioned resins, with epoxy resins and vinyl polymers, such as polyvinyl acetates, polyacrylates, polyvinylacetals, polyvinyl ethers, polyvinyl pyrrolidones and copolymers of their parent monomers being preferable. The most advantageous proportion of these resins depends on application-related requirements and the effect on the developing conditions and is in general no more than about 20% by weight of the alkali-soluble resin. For special requirements, such as flexibility, adhesion, luster and coloring, the light-sensitive mixture can also contain small amounts of substances such as polyglycols, cellulose derivatives, such as ethylcellulose, wetting agents, dyestuffs, adhesion promoters and finely divided pigments and, if required, UV absorbers.

For coating a suitable support, the mixtures are generally dissolved in a solvent. The choice of solvent must be adapted to the coating method intended, the layer thickness and the drying conditions. Suitable solvents for the mixtures according to the invention are ketones, such as methyl ethyl ketone, chlorinated hydrocarbons, such as trichloroethylene and 1,1,1-trichloroethane, alcohols, such as n-propanol, ethers, such as tetrahydrofuran, alcohol-ethers, such as ethylene glycol monoethyl ether, and esters, such as butyl acetate. It is also possible to use mixtures thereof, which can additionally contain, for special purposes, solvents such as acetonitrile, dioxane or dimethylformamide. In principle, any solvent can be used which does not react irreversibly with the layer components. Partial ethers of glycols, in particular ethylene glycol monomethyl ether, are particularly preferable.

Metals are usually used as supports for layers less than about 10 µm thick. For offset printing plates there can be used bright-rolled, mechanically or electrochemically roughened and, if appropriate, anodized aluminum, which can in addition also have been pretreated chemically, for example, with polyvinylphosphonic acid, silicates, phosphates or hexafluorozirconates or with hydrolyzed tetraethyl orthosilicate, and also multi-metal plates, for example, made of Al/Cu/Cr or of brass/chrome. To prepare letterpress printing plates, the mixtures according to the invention can also be applied to zinc or magnesium plates as well as to their commercially available microcrystalline alloys for powderless etching processes, and also to etchable plastics, such as polyoxymethylene. Owing to their firm adhesion and etch resistance on copper and nickel surfaces, the mixtures according to the invention are suitable for gravure or screen printing forms. The mixtures according to the invention can also be used as photoresists in the manufacture of printed-circuit boards and in chemical milling processes. Other supports, such as wood, paper, ceramic material, textile and other metals, are also possible for different applications, as is understood by those skilled in the art.

Preferable supports for layers more than 10 µm thick are plastic films which, in this case, act as temporary supports for transfer layers. Polyester films, for example, made of polyethylene terephthalate, are preferable for this purpose. However, polyolefin films, such as polypropylene, are also suitable.

The support material is coated in a known manner by spin-coating, spraying, dipping, roll-coating, by means of slot dies, knife-coating or by flow coating. The coating of, for example, circuit boards, glass or ceramic material and silicon disks can also be effected by the transfer of a layer from a temporary support. Exposure is effected with light sources customary in the industry. Irradiation with electrons or lasers also represents an imaging possibility known to those skilled in the art.

The aqueous-alkaline solutions of stepped alkalinity, preferably with a pH in a range of from about 10-14, which are used for developing and which can also contain relatively small amounts of organic solvents or wetting agents remove those areas of the copying layer hit by the light and thus produce a positive image of the original.

The light-sensitive mixtures according to the invention are preferably used in the preparation of printing forms, i.e., in particular offset, autotypical gravure and screen printing forms, in photoresist solutions and in so-called dry resists.

The invention is illustrated in more detail by means of the Examples which follow and in which parts by weight (pbw) are related to parts by volume (pbv) as the g relates to the $cm^3$. Unless otherwise indicated, percentages are percentages by weight.

EXAMPLE 1

A solution of 1.00 pbw of the esterification product of 1 mole of 2,3,4-trihydroxybenzophenone and 3 moles of 1,2-naphthoquinone-2-diazide-5-sulfonyl chloride, 6.20 pbw of a cresol-formaldehyde novolak having a softening range of 120°-135° C. and an average molecular weight of 1,500, 1.00 pbw of the esterification product of 1 mole of 2,2'-dihydroxy-3,5,3',5'-tetranitrodiphenylmethane and 2 moles of 1,2-naphthoquinone-2-diazide-4-sulfonyl chloride, and 0.40 pbw of a blue azo dyestuff obtained by coupling the diazonium salt of 2,4-dinitro-6-chlorobenzene with 2-methoxy-5-acetylamino-N,N-diethylaniline in 40 pbw of ethylene glycol monomethyl ether, and 50 pbw of tetrahydrofuran was used to coat an electrochemically roughened and anodized aluminum plate. Before application of the light-sensitive copying layer, the anodized support had been treated with an 0.5% strength aqueous solution of polyvinylphosphonic acid. The dry light-sensitive layer had a weight of 2.30 g/m².

The presensitized material thus prepared was imagewise exposed under a transparent positive original.

While the color of the unexposed areas of the copying layer remained deep dark blue, the color of the exposed areas of the layer changed to a color of yellow to pale brown. The image of the original was clearly visible in all details, even in the case of yellow illumination.

To prepare the printing form, the exposed printing plate was developed in a known manner with a 7.3% strength aqueous sodium metasilicate solution, whereby the exposed areas were removed. The remaining unexposed areas of the layer remained visible with good contrast to the uncolored background.

In Examples 2 to 9, which follow, the procedure of Example 1 was followed, and after exposure of the light-sensitive printing plates obtained, essentially the same good results were obtained in respect of image contrast, not only before but also after developing. In the Examples which follow, only the recipes of the coating solutions and the type of supports used are usually indicated, and further short remarks are added only occasionally.

EXAMPLE 2

Coating solution:
1.00 pbw of the esterification product of 1 mole of 2,3,4-trihydroxybenzophenone and 3 moles of 1,2-naphthoquinone-2-diazide-5-sulfonyl chloride,
6.20 pbw of the novolak indicated in Example 1,
1.00 pbw of the esterification product of 1 mole of 4,4'-dihydroxy-3,5,3',5'-tetranitrodiphenylmethane and 2 moles of 1,2-naphthoquinone-2-diazide-4-sulfonyl chloride,
0.30 pbw of an azo dyestuff obtained by coupling the diazonium salt of 2,4-dinitro-6-chlorobenzene with 2-methoxy-5-acetylamino-N-cyanoethyl-N-hydroxyethyl-aniline,
40.00 pbw of ethylene glycol monomethyl ether, and
50.00 pbw of tetrahydrofuran.
Support: electrochemically roughened and anodized aluminum plate corresponding to Example 1.
Color of the exposed areas changed from deep dark blue to yellow brown.

EXAMPLE 3

Coating solution:
0.70 pbw of the esterification product of 1 mole of 2,3,4-trihydroxybenzophenone and 2 moles of 1,2-naphthoquinone-2-diazide-5-sulfonyl chloride,
0.60 pbw of the esterification product of 1 mole of 2,2'-dihydroxy-1,1'-dinaphthylmethane and 2 moles of 1,2-naphthoquinone-2-diazide-5-sulfonyl chloride,
5.80 pbw of the novolak indicated in Example 1,
1.00 pbw of the esterification product of 1 mole of 4,4'-dihydroxy-3,3'-dinitro-5,5'-dibromobenzophenone and 2 moles of 1,2-naphthoquinone-2-diazide-4-sulfonyl chloride,
0.40 pbw of the azo dyestuff indicated in Example 1,
40.00 pbw of ethylene glycol monomethyl ether, and
50.00 pbw of tetrahydrofuran.
Support: electrochemically roughened and anodized aluminum plate corresponding to Example 1.
Color of the exposed areas changed from deep dark blue to yellow brown.

EXAMPLE 4

Coating solution:
0.70 pbw of the esterification product of 1 mole of 2,3,4-trihydroxybenzophenone and 2 moles of 1,2-naphthoquinone-2-diazide-5-sulfonyl chloride,
0.40 pbw of the esterification product of 1 mole of 2,2'-dihydroxy-1,1'-dinaphthylmethane and 2 moles of 1,2-naphthoquinone-2-diazide-5-sulfonyl chloride,
6.00 pbw of the novolak indicated in Example 1,
1.00 pbw of the esterification product of 1 mole of 3,3'-dibromo-4,4'-dihydroxy-5,5'-dinitroazobenzene and 2 moles of 1,2-naphthoquinone-2-diazide-4-sulfonyl chloride,
0.30 pbw of the blue azo dyestuff indicated in Example 2,
40.00 pbw of ethylene glycol monomethyl ether, and
50.00 pbw of tetrahydrofuran.
Support: electrochemically roughened and anodized aluminum plate corresponding to Example 1.
Color of the exposed areas changed from deep dark blue to pale brown.

EXAMPLE 5

Coating solution:
0.70 pbw of the esterification product of 1 mole of 2,3,4-trihydroxybenzophenone and 2 moles of 1,2-naphthoquinone-2-diazide-5-sulfonyl chloride,
0.40 pbw of the esterification product of 1 mole of 2,2'-dihydroxy-1,1'-dinaphthylmethane and 2 moles of 1,2-naphthoquinone-2-diazide-5-sulfonyl chloride,
5.80 pbw of the novolak indicated in Example 1,
1.00 pbw of the esterification product of 1 mole of 4,4'-dihydroxy-3,5,3',5'-tetranitrodiphenylsulfone and 2 moles of 1,2-naphthoquinone-2-diazide-4-sulfonyl chloride,
0.30 pbw of the azo dyestuff indicated in Example 1,
40.00 pbw of ethylene glycol monomethyl ether, and
50.00 pbw of tetrahydrofuran.
Support: electrochemically roughened and anodized aluminum plate corresponding to Example 1.
Color changed from deep dark blue to brown.

EXAMPLE 6

Coating solution:
1.00 pbw of the esterification product of 1 mole of 2,3,4-trihydroxybenzophenone and 3 moles of 1,2-naphthoquinone-2-diazide-5-sulfonyl chloride,
6.40 pbw of the novolak indicated in Example 1,
0.90 pbw of the esterification product of 1 mole of 2,2'-dihydroxy-3,5,3',5'-tetranitrodiphenylmethane and 2 moles of 1,2-naphthoquinone-2-diazide-4-sulfonyl chloride,
0.30 pbw of an azo dyestuff obtained by coupling 4-nitro-benzene diazonium salt with diphenylamine,
40.00 pbw of ethylene glycol monomethyl ether, and
50.00 pbw of tetrahydrofuran.
Support: Electrochemically roughened and anodized aluminum plate corresponding to Example 1.
Color of the exposed areas changed from red-brown to black.

EXAMPLE 7

Coating solution:
0.70 pbw of the esterification product of 1 mole of 2,3,4-trihydroxybenzophenone and 2 moles of 1,2-naphthoquinone-2-diazide-5-sulfonyl chloride,
0.40 pbw of the esterification product of 1 mole of 2,2'-dihydroxy-1,1'-dinaphthylmethane and 2 moles of 1,2-naphthoquinone-2-diazide-5-sulfonyl chloride,
5.80 pbw of the novolak indicated in Example 1,
0.90 pbw of the esterification product of 1 mole of 4,4'-dihydroxy-3,5,3',5'-tetranitrodiphenyl and 2 moles of 1,2-naphthoquinone-2-diazide-4-sulfonyl chloride,
0.30 pbw of the azo dyestuff indicated in Example 1,
40.00 pbw of ethylene glycol monomethyl ether, and
50.00 pbw of tetrahydrofuran.
Support: electrochemically roughened and anodized aluminum plate.
Color of the exposed areas changed from blue to brown.

EXAMPLE 8

Coating solution:

1.20 pbw of a 50% strength solution of a polyorthoester in toluene, prepared from 7,7-bis-hydroxymethyl-5-oxanonan-1-ol and trimethyl orthoformate, 0.30 pbw of the esterification product of 1 mole of 2,2'-dihydroxy-3,5,3',5'-tetranitrodiphenylmethane and 2 moles of 1,2-naphthoquinone-2-diazide-4-sulfonyl chloride, 1.00 pbw of the novolak indicated in Example 1, 0.10 pbw of the blue azo dyestuff indicated in Example 1, 20.00 pbw of ethylene glycol monomethyl ether, and 20.00 pbw of tetrahydrofuran.

Support: Electrochemically roughened and anodized aluminum plate.

Color of the exposed areas changed from dark blue to yellow-brown.

EXAMPLE 9

Coating solution:

0.60 pbw of a polyacetal prepared from triethylene glycol and 2-ethylbutyraldehyde, 0.30 pbw of the esterification product of 1 mole of 4,4'-dihydroxy-3,5,3'-5'-tetranitrodiphenylmethane and 2 moles of 1,2-naphthoquinone-2-diazide-4-sulfonyl chloride, 1.00 pbw of the novolak indicated in Example 1, 0.10 pbw of the azo dyestuff indicated in Example 1, 20.00 pbw of ethylene glycol monomethyl ether, and 20.00 pbw of tetrahydrofuran.

Support: Electrochemically roughened and anodized aluminum plate.

Color of the exposed areas changed from blue to pale brown.

What is claimed is:

1. A light-sensitive mixture, comprising:
   (a) a 1,2-quinonediazide of a mixture of
      ($a^1$) a compound forming an acid on exposure and
      ($a^2$) a compound having at least one C—O—C bond cleavable by acid;
   (b) a water-insoluble binder soluble in aqueous-alkaline solution;
   (c) an organic compound forming an acid on exposure comprising an ester of the formula I

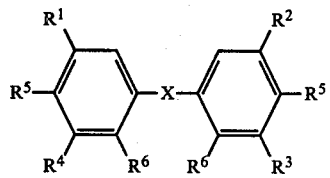

wherein

X is a single bond or one of the groups CO, $SO_2$, N=N or $CR^7R^8$, $R^1$, $R^2$, $R^3$ and $R^4$ are hydrogen atoms, halogen atoms or nitro groups, with not more than two of these groups being hydrogen atoms and at least one thereof being a nitro group, $R^5$ and $R^6$ are hydrogen atoms or 1,2-naphthoquinone-2-diazide-4-sulfonyloxy radicals, with $R^5$ and $R^6$ being always different from each other, and $R^7$ and $R^8$ are hydrogen atoms or lower alkyl radicals, and (d) a dyestuff comprising an azo dyestuff containing at least one nitro group in the molecule, said ingredients a, b, c, and d being present in such amounts that said mixture produces after imagewise exposure thereof an image of an original which is clearly visible under yellow safety light.

2. A light-sensitive mixture as claimed in claim 1, wherein $R^1$ to $R^4$ are halogen atoms or nitro groups.

3. A light-sensitive mixture as claimed in claim 1, wherein at least 2 of the radicals $R^1$ to $R^4$ are nitro groups.

4. A light-sensitive mixture as claimed in claim 1, wherein said dyestuff comprises a monoazo dyestuff.

5. A light-sensitive mixture as claimed in claim 1, wherein said azo dyestuff is present in an amount of from about 0.5 to 10% by weight relative to the content of nonvolatile constituents in said mixture.

6. A light-sensitive mixture as claimed in claim 1, wherein said binder comprises a novolak resin.

7. A light-sensitive mixture as claimed in claim 1, wherein the 1,2-quinonediazide comprises a 1,2-naphthoquinone-2-diazidesulfonic acid ester.

8. A light-sensitive mixture as claimed in claim 1, wherein the compound having at least one C—O—C bond cleavable by acid comprises an orthocarboxylic acid derivative or a compound having at least one acetal group in the molecule.

9. A light-sensitive copying material, comprising a support and a light-sensitive layer which becomes soluble in a developer on light exposure and which layer comprises a light-sensitive mixture as defined by claim 1.

* * * * *